United States Patent
Mumelter et al.

(10) Patent No.: US 9,184,475 B2
(45) Date of Patent: Nov. 10, 2015

(54) METHOD FOR CONTROLLING AT LEAST ONE OPERATING PARAMETER THAT INFLUENCES THE AGING STATE OF AN ELECTRICAL ENERGY STORE IN AN OPEN-LOOP OR CLOSED-LOOP MANNER

(75) Inventors: Georg Mumelter, Munich (DE); Felix Jonasch, Zurich (CH); Harald Hofmeier, Munich (DE); Michael Boeckl, Germering (DE); Simon Rogge, Gilching (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 863 days.

(21) Appl. No.: 13/426,252

(22) Filed: Mar. 21, 2012

(65) Prior Publication Data
US 2012/0176096 A1   Jul. 12, 2012

Related U.S. Application Data

(63) Continuation of application No. PCT/EP2010/005233, filed on Aug. 26, 2010.

(30) Foreign Application Priority Data

Sep. 23, 2009   (DE) .......................... 10 2009 042 656

(51) Int. Cl.
*H02J 7/00*   (2006.01)
*H02J 7/14*   (2006.01)
*H01M 10/48*   (2006.01)
(Continued)

(52) U.S. Cl.
CPC .......................... *H01M 10/48* (2013.01); *H02J 7/0004*(2013.01); *B60L 11/1851* (2013.01); *B60L 11/1857* (2013.01); *B60L 11/1861* (2013.01);
(Continued)

(58) Field of Classification Search
USPC .......... 320/132, 134, 144, 153, 150; 324/430, 324/427, 431
See application file for complete search history.

(56) References Cited

U.S. PATENT DOCUMENTS 5,672,951 A   9/1997 Shiota
6,480,003 B1   11/2002 Ugaji et al.
(Continued)

FOREIGN PATENT DOCUMENTS

CN   1314012 A   9/2001
CN   101222077 A   7/2008
(Continued)

OTHER PUBLICATIONS

German Search Report dated May 19, 2010 including partial English-language translation (Nine (9) pages).
(Continued)

*Primary Examiner* — Edward Tso
*Assistant Examiner* — Alexis A Boateng
(74) *Attorney, Agent, or Firm* — Crowell & Moring LLP

(57) ABSTRACT

A method is provided for the open-loop or closed-loop control of at least one operating parameter of an electric energy accumulator influencing the aging state of the electric energy accumulator. The method determines the actual aging state of the electric energy accumulator, compares the actual aging state with a target aging state predefined for the momentary age of the energy accumulator, and restricts an operating parameter range permitted for the at least one operating parameter if the actual aging state is worse than the target aging state.

13 Claims, 2 Drawing Sheets

(51) Int. Cl.
*H01M 10/42* (2006.01)
*B60L 11/18* (2006.01)

(52) U.S. Cl.
CPC ........... *H01M10/42* (2013.01); *H01M 10/4207* (2013.01); *H02J 7/0008* (2013.01); *H02J 7/0013* (2013.01)

(56) References Cited

U.S. PATENT DOCUMENTS

| | | |
|---|---|---|
| 7,072,871 B1 * | 7/2006 | Tinnemeyer ............... 706/1 |
| 2003/0215699 A1 | 11/2003 | Meissner et al. |
| 2004/0113629 A1 | 6/2004 | Laig-Hoerstebrock et al. |
| 2004/0135582 A1 | 7/2004 | Laig-Hoerstebrock et al. |
| 2005/0001625 A1 | 1/2005 | Ashtiani et al. |
| 2007/0222418 A1 * | 9/2007 | Le Gall et al. ............. 320/136 |
| 2008/0100298 A1 * | 5/2008 | Yun et al. .................. 324/430 |
| 2008/0204031 A1 * | 8/2008 | Iwane et al. ............... 324/430 |
| 2008/0284378 A1 * | 11/2008 | Birke et al. ................ 320/149 |
| 2009/0027056 A1 * | 1/2009 | Huang et al. .............. 324/439 |
| 2009/0040033 A1 | 2/2009 | Uchida |
| 2009/0205890 A1 | 8/2009 | Diegelmann et al. |
| 2009/0237087 A1 * | 9/2009 | Anbari ....................... 324/433 |
| 2009/0276172 A1 | 11/2009 | Nishi |
| 2010/0036626 A1 * | 2/2010 | Kang et al. ................. 702/63 |
| 2010/0121588 A1 * | 5/2010 | Elder et al. ................ 702/63 |
| 2011/0077879 A1 * | 3/2011 | Paryani ...................... 702/63 |

FOREIGN PATENT DOCUMENTS

| | | |
|---|---|---|
| CN | 101512365 A | 8/2009 |
| DE | 195 40 827 A1 | 5/1996 |
| DE | 102 15 071 A1 | 10/2003 |
| DE | 102 34 032 A1 | 2/2004 |
| DE | 102 49 921 A1 | 5/2004 |
| DE | 10 2007 012 127 A1 | 9/2008 |
| DE | 10 2007 023 901 A1 | 11/2008 |
| DE | 10 2008 009 568 A1 | 8/2009 |
| DE | 10 2008 062 205 A1 | 9/2009 |
| EP | 1 648 048 A2 | 4/2006 |
| EP | 1 962 099 A2 | 8/2008 |
| EP | 1 983 602 A1 | 10/2008 |
| JP | 6-140080 A | 5/1994 |
| JP | 11-165540 A | 6/1999 |
| JP | 2004-186087 A | 7/2004 |
| JP | 2005-12929 A | 1/2005 |
| JP | 2005-125916 A | 5/2005 |
| JP | 2007-216707 A | 8/2007 |
| JP | 2008-196852 A | 8/2008 |
| WO | WO 2007/114410 A1 | 10/2007 |

OTHER PUBLICATIONS

International Search Report dated Oct. 26, 2010 including English-language translation (Four (4) pages).
English-language translation of Chinese Office Action dated Nov. 20, 2013 (eight (8) pages).

* cited by examiner

METHOD FOR CONTROLLING AT LEAST ONE OPERATING PARAMETER THAT INFLUENCES THE AGING STATE OF AN ELECTRICAL ENERGY STORE IN AN OPEN-LOOP OR CLOSED-LOOP MANNER

CROSS-REFERENCE TO RELATED APPLICATIONS

This application is a continuation of PCT International Application No. PCT/EP2010/005233, filed Aug. 26, 2010, which claims priority under 35 U.S.C. §119 from German Patent Application No. DE 10 2009 042 656.6, filed Sep. 23, 2009, the entire disclosures of which are herein expressly incorporated by reference.

BACKGROUND AND SUMMARY OF THE INVENTION

The present invention relates to a method for the open-loop control or closed-loop control of at least one operating parameter influencing the aging state of an electric energy accumulator.

Hybrid vehicles are equipped with a high-voltage accumulator (battery) that stores electric energy for supplying an electric drive motor. Such high-voltage accumulators are expensive and, if possible, should therefore be designed to last for the entire service life of the vehicle. It is known that batteries are subject to physical aging, which is a function of a plurality of parameters, such as the operating temperature of the battery over time, the number of charging and discharging cycles, the charging and/or discharging swings, etc.

From JP 111 655 40, for example, it is known to protect a battery from excessive stressing and therefore excessively fast aging by a voltage limitation or an overcharging or undercharging protection.

Methods for cooling or for limiting the current of batteries are known from CN 1012 22077 or JP 2005012929. The technical background of the present invention also includes DE 10 2008 009 568.0, U.S. Pat. No. 5,672,951, JP 6140080, WO 07114410, JP 2007216707, JP 2005125916, JP 2008196852, U.S. 2005/001625, DE 102007023901, DE 102007012127, as well as JP 2004186087.

The state of the art attempts to avoid damage to the electric energy accumulator by defining constant or slightly dynamic limit values, for example, for the peak power and the constant power, the permissible voltage or the charging condition, etc. However, electric energy accumulators age also within fixedly or dynamically predefined operating limits, particularly during the charging, the discharging, and as a result of high thermal stress.

It is an object of the invention to indicate a method for the open-loop or closed-loop control of at least one operating parameter that influences the aging state of an electric energy accumulator, which makes it possible to utilize the energy accumulator as best possible for a predefined target service life.

This and other objects are achieved by a method for open-loop control or closed-loop control of at least one operating parameter of an electric energy accumulator influencing the aging state of the electric energy accumulator. The method determines the actual aging state of the electric energy accumulator. It compares the actual aging state with a target aging state predefined for the momentary age of the energy accumulator. And, it restricts an operating parameter range permitted for the at least one operating parameter if the actual aging state is worse than the target aging state.

The basic principle of the invention consists of monitoring the aging state of an energy accumulator and comparing it with a predefined target aging state and, "if required", restricting the permissible value range or the permitted operating parameter range of at least one operating parameter of the energy accumulator that can be influenced. The goal is to maintain the functioning capacity of the energy accumulator to the end of its predefined target service life; i.e., so that the energy accumulator meets predefined minimum criteria to the end of the predefined target service life.

The term "electric energy accumulator" especially comprises batteries or accumulators for electric vehicles or hybrid vehicles.

The restriction of the permissible value or of the permitted operating parameter range takes place only if required, i.e. when the actual aging state of the energy accumulator is worse than a target aging state predefined or expected for the "momentary service life" of the energy accumulator. In the present patent application, the term "State of Health" or the corresponding acronym "SoH" will also be used instead of the term "aging state".

According to a further aspect of the invention, the actual aging state of the energy accumulator is determined as a function of the internal resistance of the energy accumulator and/or as a function of the capacity of the energy accumulator.

The actual aging state of the energy accumulator preferably is determined as a function of a measured actual internal resistance and of the determined actual capacity of the energy accumulator. Methods for determining the capacity of an energy accumulator are known from the state of the art (for example, EP 1962 099 A2) and therefore do not have to be explained here in detail.

The internal resistance as well as the capacity, or a linking of both characteristics, can be used as indicators, a measurement or as important defining quantities for the aging state of an internal resistance. The internal resistance of an energy accumulator will rise as the aging state deteriorates. On the other hand, the capacity of an electric energy accumulator will decrease as the aging state deteriorates.

The aging of an electric energy accumulator is decisively influenced by its thermal stressing which, in turn, is a function of the ambient temperature, the heat generated during the charging and discharging, and the cooling of the electric energy accumulator.

In the case of the "SoH-based closed-loop control" provided according to the invention, for example, the dependency between the depth of discharge or DoD and the cyclical stressing of the energy accumulator can be utilized as a "control variable", if necessary, for slowing down the rate of aging. "Energy swings" during the charging and discharging can thereby be influenced, for example. It is known that, in the case of smaller energy swings, the degrading of the accumulator and thus the rate of aging is therefore less than in the case of greater energy swings.

According to the invention, the open-loop control or closed-loop control of the at least one operating parameter influencing the aging state of the electric energy accumulator takes place as a function of the so-called "relative deviation" $dSoH_{rel}$ of the actual aging state of the energy accumulator from the aging state expected for the momentary age of the energy accumulator, which aging state is also called herein a "target aging state." This naturally does not mean that this is an aging state to be endeavored but that the actual aging state of the energy accumulator should at most be as "bad" as the target aging state, but preferably should be better.

According to the invention, the relative deviation $dSoH_{rel}$ is used as the input quantity of a closed-loop control device or open-loop control device, which, if required, limits the permissible value range of at least one operating parameter influencing the aging state of the energy accumulator in order to ensure a certain minimum functionality until the end of a predefined target service life of the energy accumulator.

According to a further aspect of the invention, the at least one operating parameter is the charging condition of the energy accumulator, also called "state of charge" or "SoC".

It may be provided that the maximal charging limit, up to which the energy accumulator is permitted to be charged, is lowered by the open-loop control or closed-loop control if the actual SoH falls below the target state of aging $SoH_{target}$. By lowering the maximal charging limit, the possible discharging depth is reduced, which reduces the rate of aging of the energy accumulator. Although a lowering of the maximal charging limit reduces the effectively available amount of energy stored in the energy accumulator, this is intentionally accepted in order to ensure that a predefined target service life can be reached.

According to a further aspect of the invention, it may be provided that the rate of change, i.e. the gradient by which the maximal charging limit is reduced, is limited in order to make it possible for the customer or user of the energy accumulator to gradually become accustomed to a reduction of the maximal charging limit, rather than have an abrupt experience.

In addition or as an alternative, for lowering the maximal charging limit $SoC_{max}$, the permissible lower charging limit $SoC_{min}$, to which the energy accumulator is permitted to be discharged, may be raised when there is a falling below the target aging state, in order to always provide the electric energy required for a cold start of the vehicle also in the case of an aged energy accumulator. It may be provided that the raising of the minimal charging limit $SoC_{min}$ takes place independently of the intensity of the aging and of the SoH closed-loop control above $SoC_{max}$.

According to the invention, an operating strategy may be provided, which additionally expands the methods known from the state of the art for protecting the energy accumulator. Electric accumulators age particularly when currents are very high or in the case of a high power output. In order to limit or control the aging of the electric accumulator, it may be provided that, as a function of the relative deviation $dSoH_{rel}$ of the actual aging state $SoH_{act}$ from the target aging state $SoH_{target}$, the maximally permissible or available charging and discharging power is restricted. For this purpose, predefined power limits, which can also be predefined as dynamic power limits, i.e., for example, time-dependent power limits or power limits dependent on the voltage level, are multiplied by a weighting factor between zero and one. In order to design the intervention of the open-loop control or closed-loop control such that it will not be noticeable to the customer or user, the maximal gradient of the weighting factor as well as its lower limit may be restricted. If required, power peaks will be avoided as a result of this intervention. The thermal stressing of the accumulator will correspondingly also be reduced.

As an additional intervention possibility, it may be provided that temperature limits are dynamically adapted. The static limit values known from the state of the art define as of which temperature the accumulator is cooled or as of which temperature the cooling will be deactivated again. Such static temperature limits keep the accumulator temperature below a certain value. However, if the aging of the energy accumulator is significantly determined by the thermal stressing, for example, if a vehicle is used in a "hot-climate country", an adaptation of the temperature limits may be useful. These temperature limits may be changed, especially lowered, as a function of the actual aging state of the energy accumulator. As a result of lowering the temperature limits, the average temperature of the electric accumulator will be lower, and the cooling time of the electric accumulator will be shortened when the vehicle is parked. In order to ensure that the closed-loop control will not be noticed by the customer, it may also be provided here that the gradient of the lowering of the temperature limits is restricted.

Other objects, advantages and novel features of the present invention will become apparent from the following detailed description of one or more preferred embodiments when considered in conjunction with the accompanying drawings.

DETAILED DESCRIPTION OF THE DRAWINGS

Figure 1:
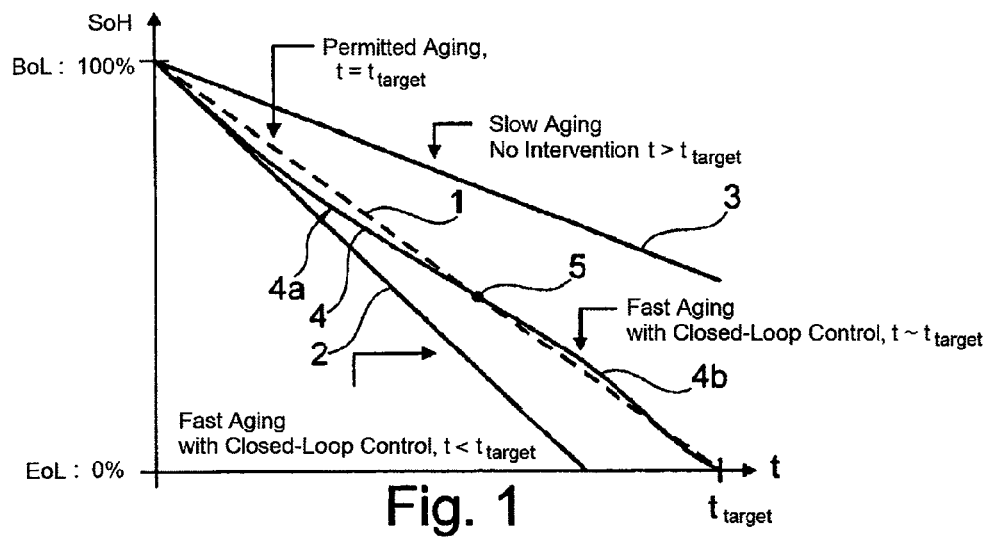
FIG. 1 is a graphical diagram explaining the basic principle of aging control according to the invention.

In FIG. 1, the time t or the "service life" of a high-voltage battery of a vehicle is plotted on the abscissa, and the aging state SoH of an energy accumulator is plotted on the ordinate.

The broken line marked 1 describes the permissible aging of the energy accumulator over time. The energy accumulator ages starting from its initial state BoL of 100%, in which the energy accumulator is completely operable, until its operability falls to an aging state EoL of 0%. In this context, 0% means that the energy accumulator just barely still has a predefined minimum operability. It does not mean that the energy accumulator does not function at all. $T_{target}$ is the target service life for which the energy accumulator should at least be operable to such an extent that the predefined functions are carried out.

The aging line marked 2 describes an excessively fast aging. When the aging is too fast, the energy accumulator will not reach the provided target service life $t_{target}$, at least not while meeting target power criteria.

The line marked 3 describes a slower aging than the aging marked 1 that is expected by the manufacturer.

The aging line marked 4 describes an aging course, in which case the closed-loop aging control intervenes in an embodiment according to the invention. In a range 4a, the actual aging state of the energy accumulator is worse than the target aging state. In range 4a, the aging line is correspondingly situated below the permissible aging line 1. In range 4a, the aging line 4 is concavely curved, which indicates that the aging control is already intervening. At point 5, the aging line 4 intersects with the target aging line 1 and, in range 4b, still deviates only very little from the target aging line 1. As a result of the intervention of the aging control, the endeavored target service life $t_{target}$ will specifically be reached.

Figure 2:
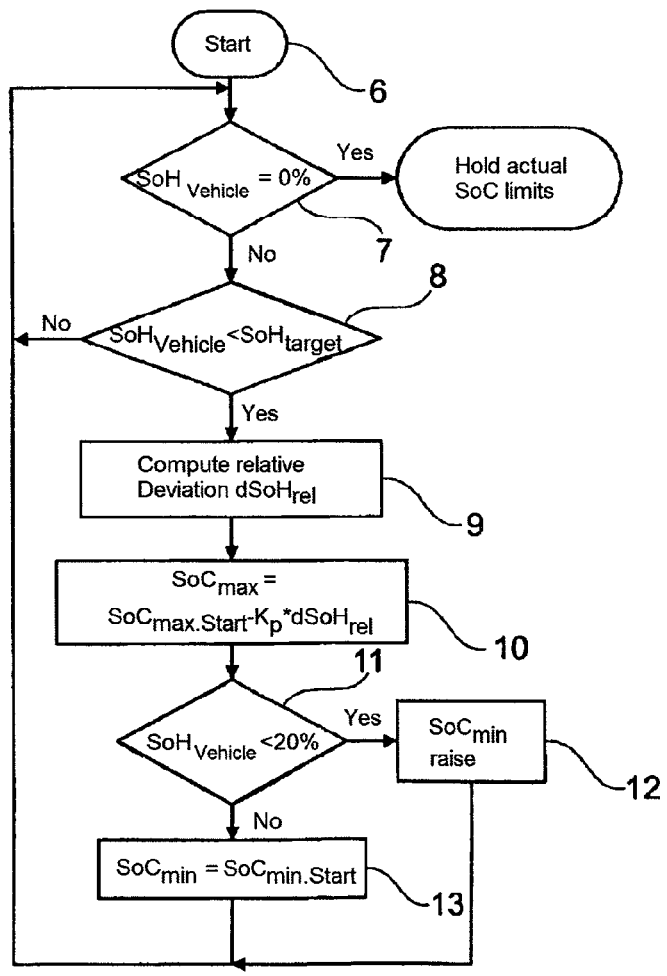
FIG. 2 is a flow chart describing an exemplary algorithm for the reduction of the SoC limits.

FIG. 2 describes an algorithm for reducing the charging condition limits. Beginning with a starting Step 6, it is checked whether the actual aging state $SoH_{VEH}$ equals 0%. If this is so (true), the actual charging condition limits will be maintained. If this is not so (not true), it is checked whether the actual aging state $SoH_{VEH}$ is less than the target aging state $SoH_{target}$. If this is not so, a return to Step 7 takes place after passing-through of Step 8. If this is so, the relative deviation $dSoH_{rel}$ is computed, wherein $dSoH_{rel}=SOH_{VEH}-SoH_{target}$.

In Step 10, the upper permissible charging condition limit $SoC_{max}$ according to an aspect of the invention is adapted: $SoC_{max} = SOC_{max,Start} - K_P \times dSoH_{rel}$. $K_P$ is a proportionality factor. $SoC_{max,Start}$ is a starting value for the permissible upper charging condition limit predefined for the new-value energy accumulator.

In Step 11, it is checked whether the actual aging state $SoH_{VEH}$ is less than 20%. If this is so, the permissible lower charging condition limit $SoC_{min}$ is raised in Step 12 and a return takes place to Step 7. In contrast, if the actual aging state $SoH_{VEH}$ is greater than or equal to 20%, a permissible lower charging condition limit $SoC_{min,start}$ is maintained that is predefined for a new-value energy accumulator.

Figure 3:
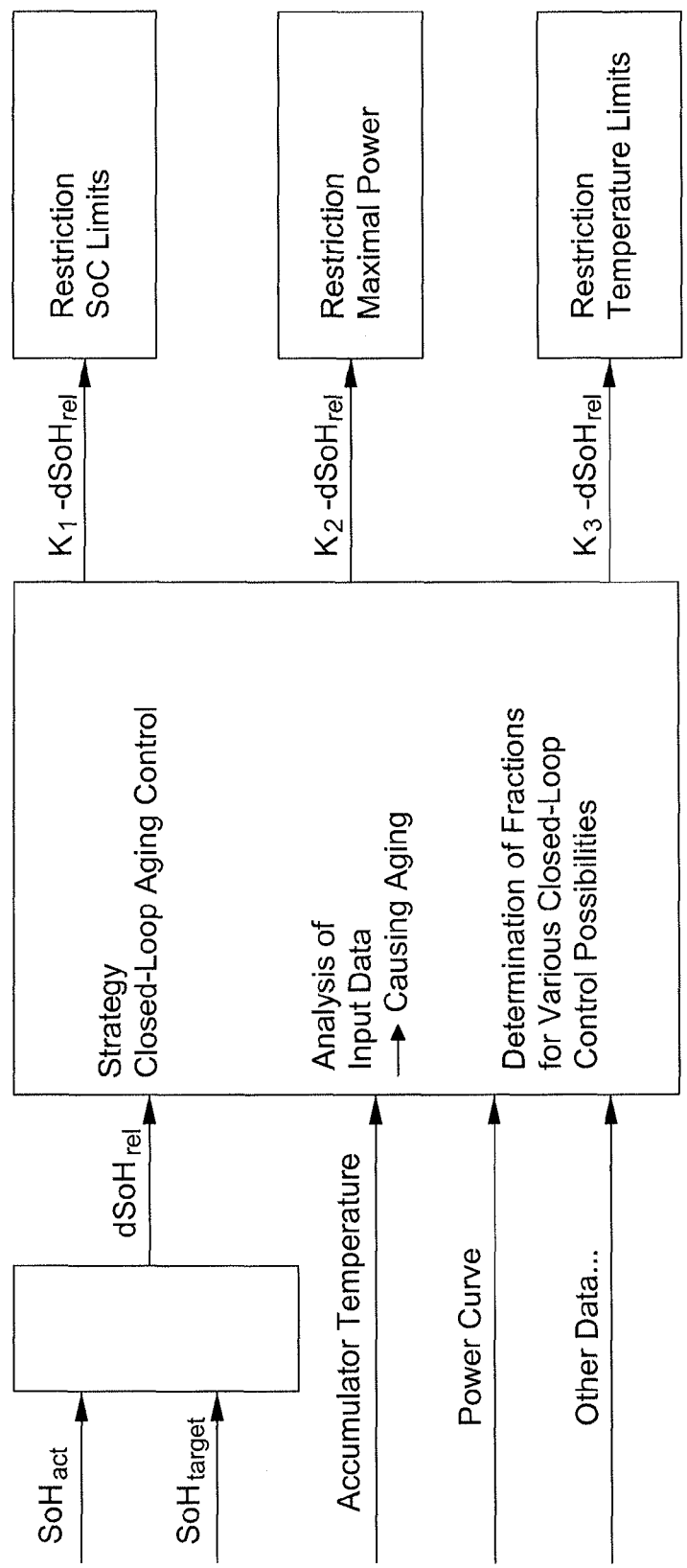
FIG. 3 is a block diagram of the basic principle of an aging control during which several operating parameters are taken into account.

FIG. 3 illustrates the basic principle of the invention while taking into account several operating state parameters. The relative deviation $dSoH_{rel}$ is formed from the actual aging state $SoH_{act}$ and the target aging state $SoH_{target}$ predefined for the momentary age of the energy accumulator. Also taken into account are the course of the temperature or the course of the previous accumulator temperature, the power curve of the electric power supplied to the accumulator and/or of the electric power withdrawn from the accumulator, and possible additional operating parameters influencing the aging state of the electric accumulator.

As a function of these input quantities when the actual aging state $SoH_{act}$ is worse than the target aging state $SoH_{target}$: (1) the lower and/or the upper permissible charging condition limit and, therefore, the permissible charging condition range, can be restricted, (2) the maximally permissible charging and/or discharging power of the energy accumulator can be reduced, (3) the temperature limits as of which the electric energy accumulator has to be cooled and/or to which the electric energy accumulator may be cooled, can be adapted.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for open-loop or closed-loop control of at least one operating parameter of an electric energy accumulator that influences an aging state of the electric energy accumulator, the method comprising the acts of:
   determining an actual aging stage of the electric energy accumulator, wherein the electric energy accumulator has a predefined target service life;
   comparing the determined actual aging stage with a target aging state, the target aging state being predefined, as a function of the predefined target service life, for a momentary age of the electric energy accumulator; and
   restricting an operating parameter range permitted for the at least one operating parameter if the actual aging state is worse than the target aging state.

2. The method according to claim 1, wherein the act of determining the actual aging state further comprises the act of determining the actual aging state of the electric energy accumulator as a function of an internal resistance of the electric energy accumulator.

3. The method according to claim 2, further comprising the act of measuring the internal resistance of the electric energy accumulator.

4. The method according to claim 1, wherein the act of determining the actual aging state of the electric energy accumulator further comprises the act of determining the actual aging state as a function of an actual capacity of the electric energy accumulator.

5. The method according to claim 2, wherein the act of determining the actual aging state of the electric energy accumulator further comprises the act of determining the actual aging state as a function of an actual capacity of the electric energy accumulator.

6. The method according to claim 4, wherein the actual aging state of the electric energy accumulator is determined as a function of an internal resistance and the actual capacity of the electric energy accumulator.

7. The method according to claim 5, wherein the actual aging state of the electric energy accumulator is determined as a function of the internal resistance and the actual capacity of the electric energy accumulator.

8. The method according to claim 1, wherein the at least one operating parameter is a charging condition of the electric energy accumulator, wherein the restricting act restricts a permissible charging condition range with respect to a momentarily still permissible charging condition range if the actual aging state is worse than the target aging state.

9. The method according to claim 7, wherein the at least one operating parameter is a charging condition of the electric energy accumulator, wherein the restricting act restricts a permissible charging condition range with respect to a momentarily still permissible charging condition range if the actual aging state is worse than the target aging state.

10. The method according to claim 1, wherein the at least one operating parameter is at least one of a charging and discharging power of the electric energy accumulator, the restricting act restricting a range of permissible charging or discharging powers with respect to a momentarily still permissible range if the actual aging state is worse than the target aging state.

11. The method according to claim 7, wherein the at least one operating parameter is at least one of a charging and discharging power of the electric energy accumulator, the restricting act restricting a range of permissible charging or discharging powers with respect to a momentarily still permissible range if the actual aging state is worse than the target aging state.

12. The method according to claim 1, wherein the at least one operating parameter is an energy accumulator temperature, the restricting act restricting a permissible energy accumulator temperature range with respect to a momentarily still permissible energy accumulator temperature range if the actual aging state is worse than the target aging state.

13. The method according to claim 7, wherein the at least one operating parameter is an energy accumulator temperature, the restricting act restricting a permissible energy accumulator temperature range with respect to a momentarily still permissible energy accumulator temperature range if the actual aging state is worse than the target aging state.

\* \* \* \* \*